(12) United States Patent
Fox et al.

(10) Patent No.: US 6,682,772 B1
(45) Date of Patent: Jan. 27, 2004

(54) HIGH TEMPERATURE DEPOSITION OF PT/TIO$_x$ FOR BOTTOM ELECTRODES

(75) Inventors: Glen R. Fox, Colorado Springs, CO (US); KouKou Suu, Inba (JP)

(73) Assignees: Ramtron International Corporation, Colorado Springs, CO (US); Ulvac Japan, Ltd., Methuen, MA (US)

(*) Notice: Subject to any disclaimer, the term of this patent is extended or adjusted under 35 U.S.C. 154(b) by 0 days.

(21) Appl. No.: 09/556,255

(22) Filed: Apr. 24, 2000

(51) Int. Cl.[7] ............................................ B05D 5/12
(52) U.S. Cl. ....................... 427/79; 427/80; 29/25.03; 29/25.35; 29/25.41; 29/25.42
(58) Field of Search ................... 427/79, 80; 29/25.41, 29/25.42, 25.03, 25.35; 216/6, 75

(56) References Cited

U.S. PATENT DOCUMENTS

| | | | | |
|---|---|---|---|---|
| 5,443,688 A | * | 8/1995 | Toure et al. ................ | 438/3 |
| 5,555,486 A | * | 9/1996 | Kingon et al. ............... | 361/305 |
| 5,798,903 A | * | 8/1998 | Dhote et al. ............... | 361/321.4 |
| 5,950,292 A | * | 9/1999 | Dimos et al. ............... | 29/25.42 |
| 6,287,637 B1 | * | 9/2001 | Chu et al. ................ | 427/376.2 |

* cited by examiner

*Primary Examiner*—Brian K. Talbot
(74) *Attorney, Agent, or Firm*—Hogan & Hartson L.L.P.

(57) ABSTRACT

A platinum deposition method uses a combination of an oxide adhesion layer and a high temperature thin film deposition process to produce platinum bottom electrodes for ferroelectric capacitors. The platinum bottom electrode is deposited onto a TiO$_x$ layer at temperatures between about 300 and 800° C. Deposition at high temperatures changes the platinum stress from compressive to tensile, increases platinum grain size, and provides a more thermally stable substrate for subsequent PZT deposition.

9 Claims, 6 Drawing Sheets

HIGH TEMPERATURE DEPOSITION OF PT/ TIO$_x$ FOR BOTTOM ELECTRODES

FIELD OF THE INVENTION

The present invention relates to a method of manufacturing platinum bottom electrodes for ferroelectric capacitors. More particularly, the present invention relates to a method of manufacturing a platinum bottom electrode which provides a thermally stable substrate for subsequent PZT deposition and processing.

BACKGROUND OF THE INVENTION

Ferroelectric thin film capacitors that are used for ferroelectric memory applications can be switched between two polarization states with the application of an electric field. Upon switching between the two polarization states, a switching current is produced that can be sensed by an external circuit. In order to determine the memory state stored in the capacitor, the switching current must be sufficiently large so that it can be sensed by the accompanying sense circuit. For this reason, a large switchable polarization is desired for the ferroelectric capacitor.

During repeated polarization switching of the ferroelectric capacitor due to read and write operations, the switchable polarization is commonly reduced. This phenomenon is commonly known as fatigue. Fatigue will eventually result in a reduction of the ferroelectric switchable polarization to the point where the memory will fail. For this reason, it is necessary to produce capacitors that exhibit little or no fatigue.

In addition to having a high switchable polarization and a low fatigue rate, thin film ferroelectric capacitors must also be stable with respect to mechanical stress and thermal cycling. High thin film stresses can result in delamination between electrode/ferroelectric or electrode/substrate interfaces. Films that undergo microstructural changes due to exposure to high temperatures also can induce high film stress and can also adversely affect the growth of subsequent films and process reproducibility. If the films composing the ferroelectric capacitor exhibit high stresses or thermal instability, there is a high risk of delamination and variability during subsequent processing steps required for integration of the capacitor with CMOS circuitry. High film stress and thermal instability can also make the final memory more susceptible to long term failure.

SUMMARY OF INVENTION

It is an object of the present invention to improve the resistance of a ferroelectric capacitor to fatigue as compared to ferroelectric capacitors manufactured using standard prior art cold platinum bottom electrode deposition techniques.

It is a further object of the present invention to reduce the overall stress and to increase the thermal stability of a ferroelectric capacitor stack as compared to prior art ferroelectric capacitor stacks.

In accordance with the aforesaid objects, the present invention provides a means for reproducible control of ferroelectric PZT crystallographic texture and the corresponding switchable polarization. In this way, thermal stability and fatigue are improved and stress and platinum sheet resistance are reduced.

According to the present invention, a platinum deposition method uses a combination of an oxide adhesion layer and a high temperature thin film deposition process to produce platinum bottom electrodes for ferroelectric capacitors. The platinum bottom electrode is deposited onto a TiO$_x$ layer at temperatures between about 300 and 800° C. Deposition at high temperatures changes the platinum stress from compressive to tensile, increases platinum grain size, and provides a more thermally stable substrate for subsequent PZT deposition.

DETAILED DESCRIPTION

Figure 1:
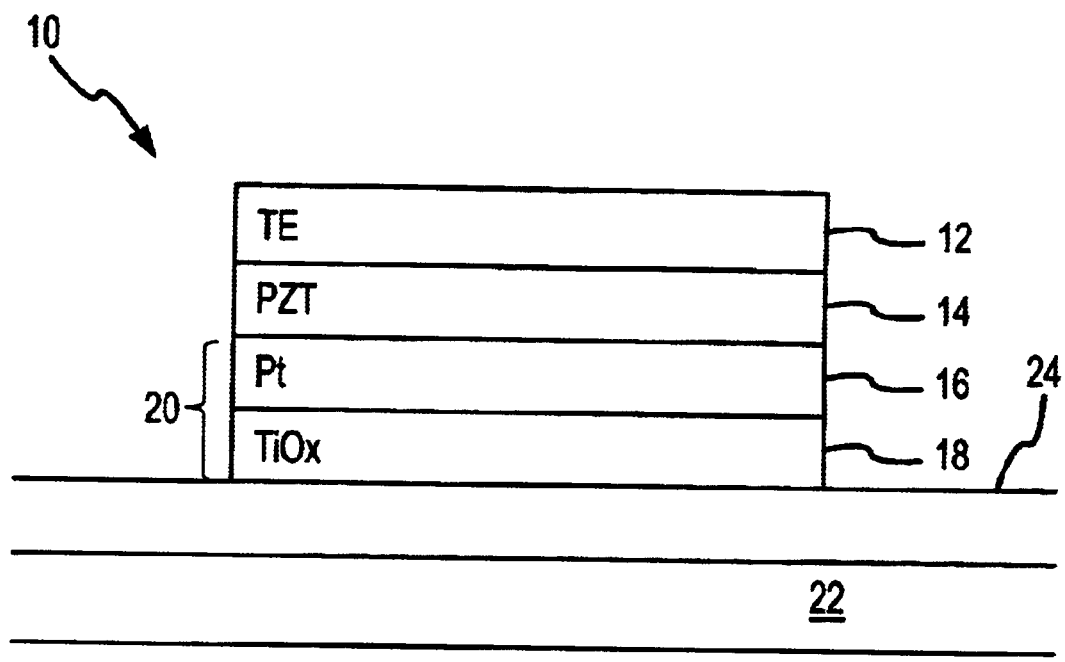
FIG. 1 is a cross-sectional diagram of a ferroelectric capacitor structure with a platinum bottom electrode deposited at high temperature according to the present invention.

Referring now to FIG. 1, a diagram of a ferroelectric capacitor structure 10 is shown with a platinum bottom electrode 20 deposited at high temperature. The basic structure for the platinum bottom electrode 20 is shown in FIG. 1 wherein a planar substrate 22, commonly silicon, is coated with a layer 24 of SiO$_2$. A TiO$_x$ adhesion layer 18 of less than or equal to 50 nm is deposited on the SiO$_2$ to act as an adhesion layer between the SiO$_2$ and platinum layer 16. The TiO$_x$ layer 18 can be formed by a variety of methods including reactive sputtering of titanium in oxygen containing atmospheres, thermal oxidation of titanium films, as well as other methods known to those skilled in the art. If the TiO$_x$ is deposited by reactive magnetron sputtering, the titanium metal sputtering target can be sputtered in either a pure O$_2$ atmosphere, or a mixed gas atmosphere containing O$_2$ such as Ar/O$_2$. Total deposition pressure can range from 1 to 50 mT and the O$_2$ partial pressure can range from 0.01 to 50 mT. For sputtering, a power of 0.5 to 10 kWatts can be applied to the titanium target. The TiO$_x$ can be deposited onto unheated substrates or substrates heated to temperatures as high as 800° C.

After deposition of the TiO$_x$ layer 18, a platinum layer 16 is deposited by sputter deposition while the substrate 22 is maintained at a temperature between about 300 and 800° C. The platinum layer 16 is deposited to a thickness of up to 500 nm using a cathode power of 0.3 to 5 kW and an inert gas atmosphere with a pressure of 1 to 50 mT. After deposition of the platinum bottom electrode 16, a PZT dielectric layer 14 is deposited. The PZT layer 14 can be deposited at low temperature (from 0 to 200° C.) and then annealed at 500 to 800° C. to obtain the desired perovskite ferroelectric phase, or it can be deposited at elevated temperature (from 400 to 800° C.) to produce the desirable ferroelectric phase in situ. Ideally, the ferroelectric anneal includes a first anneal at a temperature range of about 500 to 650° C. in a mixed argon and oxygen atmosphere and a second anneal at a temperature range of about 700 to 750°C. in an oxygen atmosphere. The PZT layer can be between about 300 angstroms and 2 [u]m thick.

Formation of the capacitor structure 10 is completed by depositing a top electrode layer 12 that can consist of metals, such as platinum, or conducting oxides, such as IrOx. The top electrode layer is typically deposited to a thickness range of 30 to 50 nm and at a temperature range of about 0 to 500° C. Alternative top electrode materials can include iridium, $IrO_2$, $SrRuO_3$, as well as other noble metals and noble metal oxides.

The ferroelectric capacitor structure 10 shown in FIG. 1 is formed by etching layers 12 (top electrode), 14 (PZT or ferroelectric dielectric), 16 (platinum bottom electrode), and 18 ($TiO_x$ adhesion) as follows: Photoresist is deposited to define the top electrode area. The top electrode is then etched by reactive or physical ion etching. Etching is stopped at the surface of the PZT layer. The photoresist is then stripped and another layer of photoresist is deposited and exposed to define the desired area of the PZT layer. The PZT layer is then etched by reactive or physical ion etching or wet chemical etching. Etching is stopped at the surface of the bottom electrode. Finally, a third layer of photoresist is used to define the desired bottom electrode area, which is larger than the PZT area. Both the platinum bottom electrode and the $TiO_x$ adhesion layer are etched by reactive ion or physical ion etching. Etching is stopped at the surface of the underlying $SiO_2$ layer.

Figure 2:
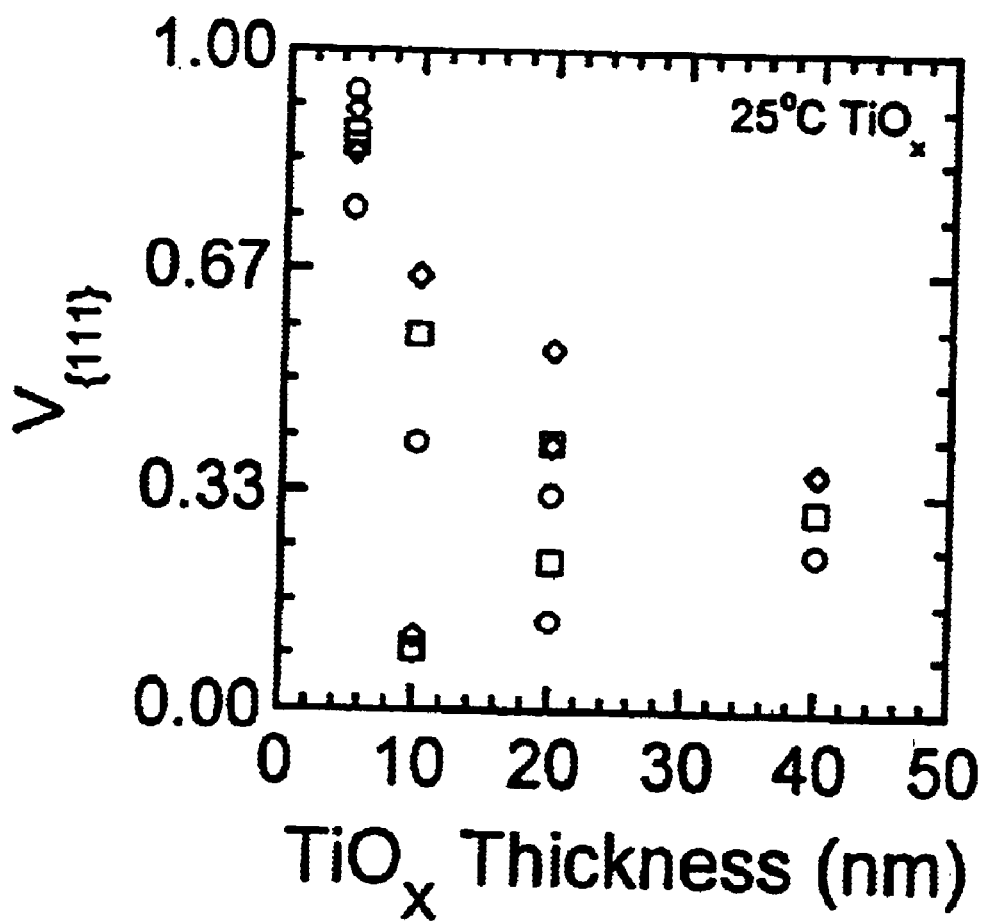
FIG. 2 is a plot that shows how an increase in the thickness of the TiO$_x$ adhesion layer decreases the PZT {111} oriented volume fraction from greater than 90% to less than 10%.
Figure 3:
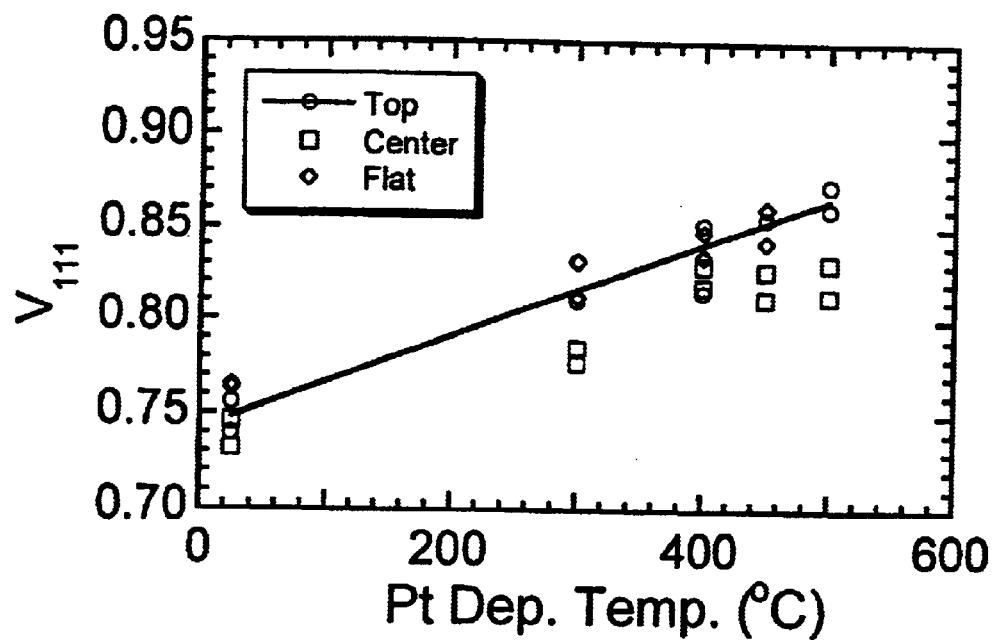
FIG. 3 is a plot that shows increasing the platinum deposition temperature also increases the PZT {111} volume fraction.

In a first aspect of the method of the present invention, the $TiO_x$/Pt electrode bottom electrode 20 deposited at high temperature provides a means for controlling PZT crystallographic texture and the magnitude of switchable polarization. The plot of FIG. 2 shows that an increase in the thickness of the $TiO_x$ adhesion layer 18 decreases the PZT {111}oriented volume fraction in the PZT dielectric layer 14 from greater than 90% to less than 10% Increasing the Platinum deposition temperature also increases the PZT {111}volume fraction as shown in the plot of FIG. 3.

Figure 4:
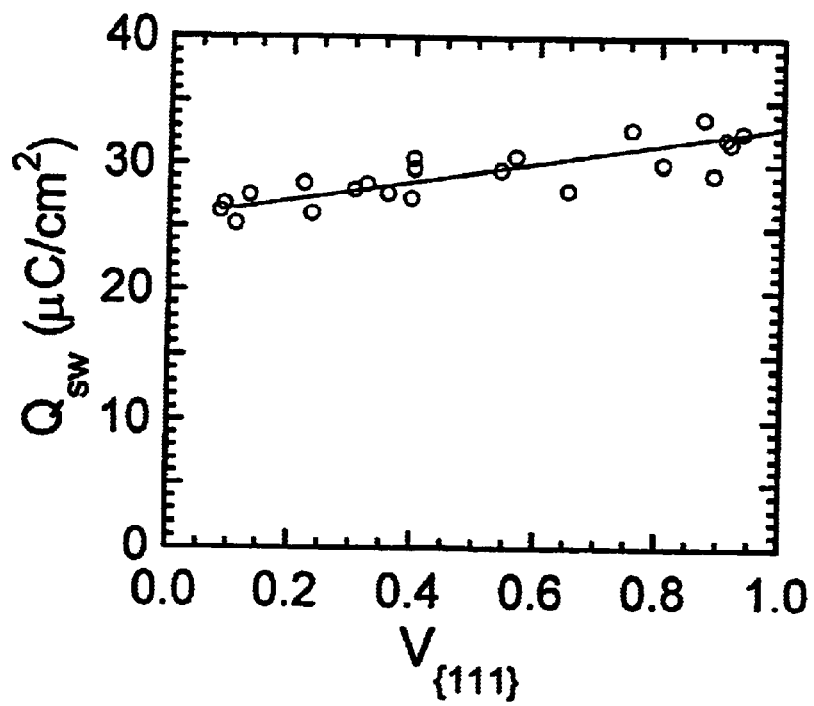
FIG. 4 is a plot that shows the relationship between the PZT {111} volume fraction and the PZT switchable polarization.

Because it is possible to control the PZT {111}volume fraction by changing the $TiO_x$ layer 18 thickness and platinum deposition temperature, it is also possible to control the switchable polarization of the PZT capacitor 10. The polarization in PZT only lies along the <001>and <111>directions for tetragonal and rhombahedral PZT crystal grain structures, respectively. When the PZT thin film 14 has a {111}crystallographic texture, the polarization of the PZT grains composing the PZT film add to give a net polarization that is larger than that which can be obtained with randomly oriented grains. For this reason, it is preferred that the PZT layer 14 has a maximized {111}texture in order to optimize the switchable polarization. The relationship between the PZT {111}volume fraction and the PZT switchable polarization is shown in the plot of FIG. 4. These results show that the platinum bottom electrode 20 deposited at elevated temperature provides a means for obtaining improved switchable polarization performance. It should also be noted that the lateral uniformity attained with {111}textured PZT films in comparison with randomly oriented films is highly desirable for FRAM memories that utilize submicron capacitor sizes.

Figure 5:
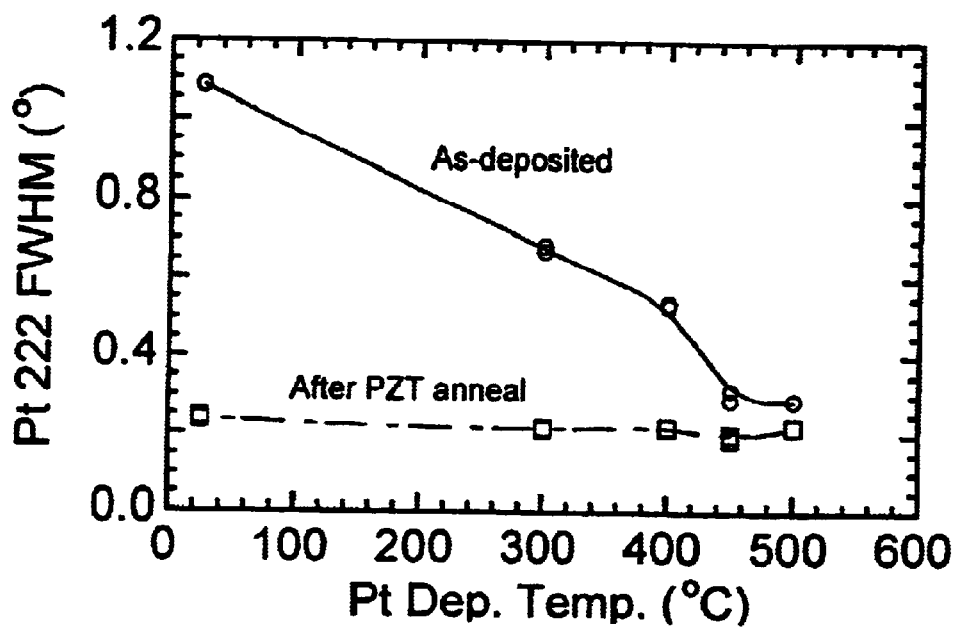
FIG. 5 is a plot of the full-width-at-half-maximum intensity (FWHM) of the Pt 222 peak change for platinum films with respect to temperature.
Figure 6:
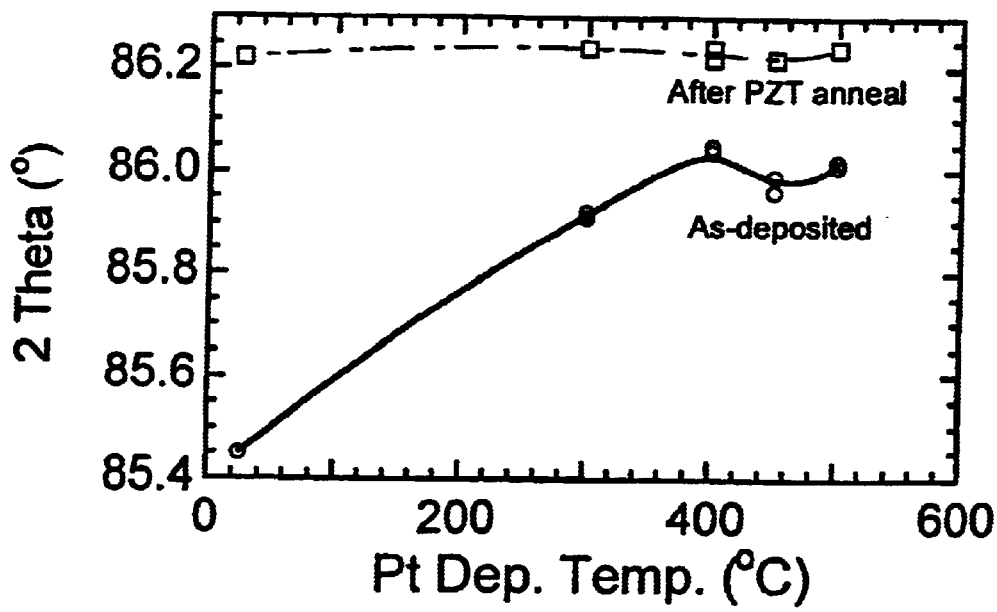
FIG. 6 is a plot of the Bragg angle of the Pt 222 peak change with respect to temperature.

In a second aspect of the method of the present invention, platinum deposited at elevated temperatures has a higher thermal stability than when deposited without substrate heating. This can be seen by observing changes in the X-ray diffraction pattern obtained from the as-deposited platinum film and platinum films that were annealed with a PZT coating. Both the full-width-at-half-maximum intensity (FWHM) and the Bragg angle of the Pt 222 peak change significantly for platinum films deposited without substrate heating as shown in the plots of FIG. 5 and FIG. 6, respectively. Note that the platinum is deposited at a temperature sufficiently above 300° C. such that the Pt 222 peak XRD Bragg reflection angle and the full width at half maximum intensity changes by less than 0.30°2θ during the PZT anneal process. The anneal induced changes in these two metrics is significantly reduced for Platinum films deposited at elevated substrate temperatures according to the method of the present invention. The FWHM is inversely proportional to the grain size of the platinum film, while the Bragg angle is directly related to the platinum unit cell size. Anneal induced changes in the FWHM indicate that platinum films deposited without substrate heating undergo a significant grain growth. Shifts in the Bragg angle with annealing signify changes in the platinum unit cell size, which is likely to be related to changes in the platinum film stress. The fact that platinum films deposited at elevated temperatures exhibit much smaller anneal induced changes in FWHM and Bragg angle proves that these films have improved thermal stability.

Figure 7:
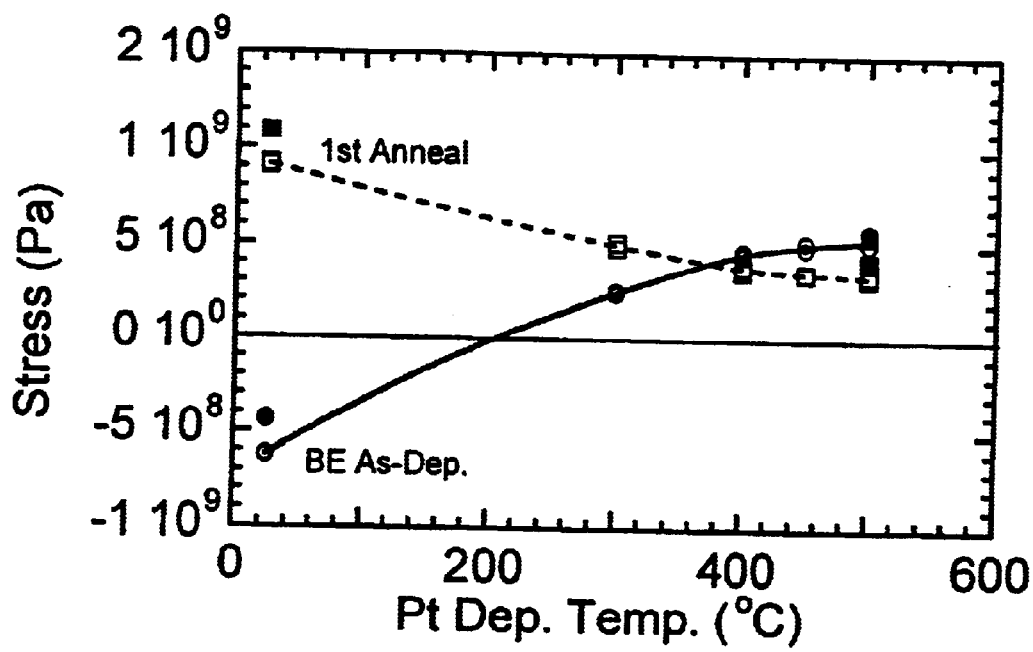
FIG. 7 is a plot of stress in the platinum bottom electrode with respect to the platinum deposition temperature.

In a third aspect of the present invention, platinum bottom layer 16 deposition at elevated temperature results in reduction in stress and reduction in changes in stress that otherwise occurs during processes subsequent to platinum bottom electrode 16 deposition. Platinum deposited without substrate heating has a compressive stress of approximately 0.6 GPa for a 100 nm thick film. During the anneal of the overlying PZT film (200 nm thick), stress changes in the platinum bottom electrode 16 results in a combined PZT layer 14 plus bottom electrode 20 stress of approximately 1.0 GPa. When the platinum deposition temperature is increased the as-deposited platinum film 16 stress changes from compressive to tensile and at temperatures above 300° C. there is nearly no difference in stress between the as deposited platinum and the combined annealed of the PZT layer 16 plus bottom electrode 20 stack. This is clearly illustrated in the plot of FIG. 7. Note that the platinum is deposited at a temperature sufficiently above 300° C. such that the stress is between about 0.3 and 0.6 GPa as deposited and changes by less than 0.5 GPa during PZT anneal. The fact that changes in stress induced by the PZT anneal are reduced supports the claim that thermal stability is increased. In addition, the total stress of the PZT plus bottom electrode stack after PZT anneal is lower for the stack produced with the Pt film deposited at elevated temperature. This reduction in stress lowers the risk of failure due to film delamination and stress induced corrosion during subsequent processing steps and in the final FRAM product. Therefore reliability of the ferroelectric capacitor 10 is increased.

Figure 8:
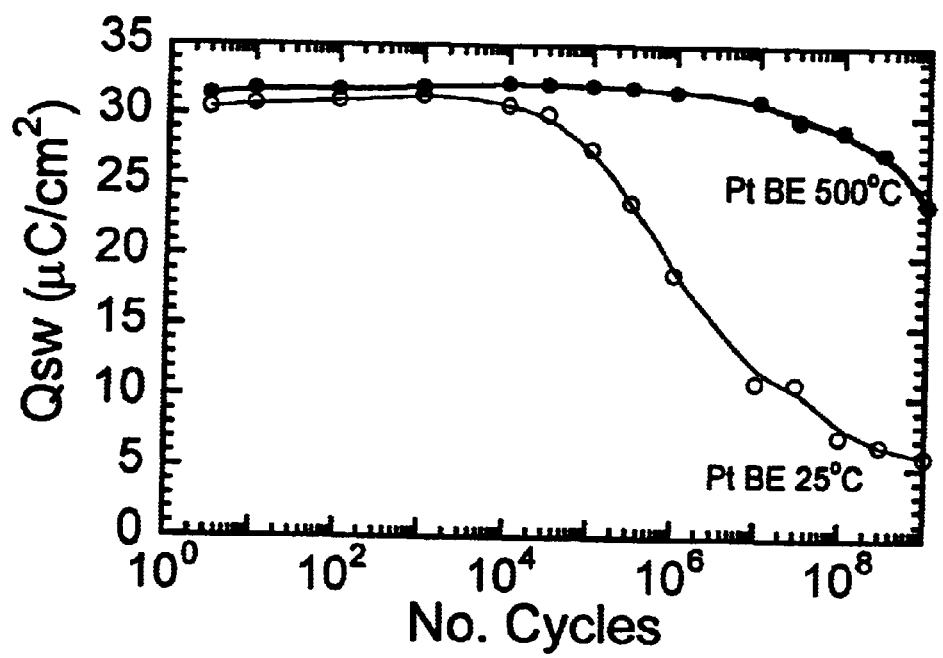
FIG. 8 is a plot of switched charge versus switching cycles, illustrating a significant improvement in fatigue obtained by using a platinum bottom electrode deposited at elevated temperature according to the present invention.

In a fourth aspect of the method of the present invention, improved fatigue performance is obtained with the platinum bottom electrode 20 deposited at elevated temperature. Fatigue performance is determined by measuring the switchable polarization as a function of the number of switching cycles undergone by a ferroelectric capacitor. Fatigue performance determines the number of read/write cycles that a FRAM memory can withstand before failure. The improvement in fatigue obtained by using a platinum bottom electrode 20 deposited at elevated temperature is demonstrated in the plot of FIG. 8. After 10E9 switching cycles, the capacitor containing the platinum bottom electrode 20 deposited at elevated temperature according to the present invention exhibits a significantly higher switchable polarization than the capacitor produced with Pt deposited without substrate heating. Note that the platinum is deposited at a temperature sufficiently above 300° C. such that the PZT capacitor fatigues by less than 30% after 10E9 switching cycles. The improved fatigue performance with the elevated temperature platinum deposition extends the number of FRAM memory read/write cycles.

Figure 9:
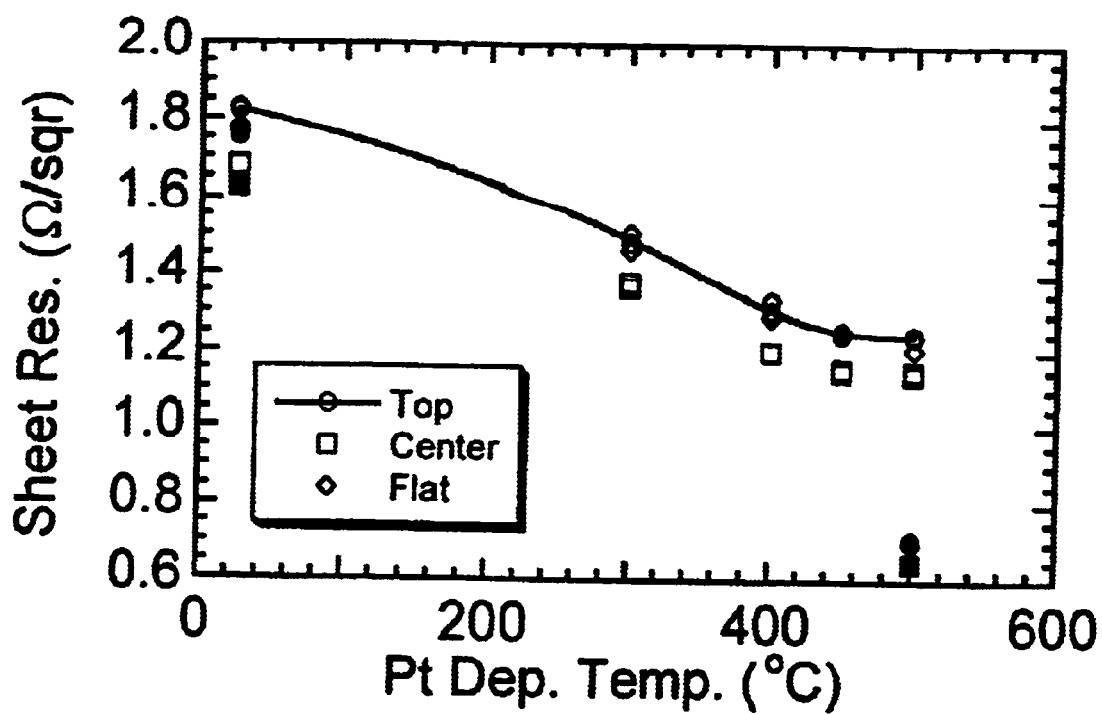
FIG. 9, is a plot of sheet resistance versus platinum deposition temperature, which shows that deposition of the platinum bottom electrode at elevated temperature reduces the sheet resistance of the platinum film at a fixed thickness.

In a fifth aspect of the method of the present invention, platinum bottom electrode deposition at elevated temperature results in a reduction in the sheet resistance. Sheet resistance determines the speed at which charge can be supplied to the ferroelectric capacitor for switching. This ultimately influences the operating speed of a FRAM memory. In the plot of FIG. 9, it can be seen that deposition of the Platinum bottom electrode 20 at elevated temperature reduces the sheet resistance of a film with a fixed thickness. The lower sheet resistance allows higher speed operation of a FRAM memory or allows a reduction in the bottom electrode thickness without loss of memory speed. Reducing the platinum bottom electrode 20 thickness is important when scaling the memory to obtain higher memory densities.

Having described and illustrated the principle of the invention in a preferred embodiment and method thereof, it is appreciated by those skilled in the art that the invention can be modified in arrangement and detail without departing from such principles. For example, while a silicon/$SiO_2$ substrate is typically used, other suitable substrates such as GaAs, SiC, and $Si/Si_3N_4$ can also be used. While the preferred substrate temperature is given as a range of 300 to 800° C., a tighter range of 450 to 600° C. is more desirable, with an optimum temperature of about 500° C. While the ranges can be extended on either side a lower temperature will greatly reduce the benefits of the present invention while a higher temperature may cause roughening of the platinum surface. The top electrode layer is typically platinum, but iridium, iridium oxide, and other conductive oxides may be used. It is important that $TiO_x$ and not titanium form the adhesion layer and that this layer provide a smooth surface for the high temperature platinum deposition. It is also recommended that the platinum be deposited at low sputtering power (less than one kW) and low pressure (less than ten mT). We therefore claim all modifications and variations of the method of the present invention coming within the spirit and scope of the following claims.

We claim:

1. A method of forming a ferroelectric capacitor on a substrate comprising:

forming an adhesion layer on the substrate;

forming a single platinum thin film layer directly deposited at temperatures sufficiently above 300° C. on the adhesion layer;

forming a ferroelectric layer on the platinum thin film layer;

annealing the ferroelectric layer;

forming a top electrode layer on the ferroelectric layer; and etching each of the adhesion, platinum, ferroelectric and top electrode layers to form the ferroelectric capacitor, such that the PZT capacitor fatigues by less than 30% after 10E9 switching cycles.

2. The method of claim 1 in which forming the adhesion layer comprises forming a $TiO_x$ adhesion layer having a thickness of less than or equal to 50 nm.

3. The method of claim 1 in which forming the adhesion layer comprises forming a $TiO_x$ adhesion layer having a thickness of less than or equal to 10 nm such that the {111} texture and the corresponding switchable polarization of a subsequently deposited PZT layer is significantly improved.

4. The method of claim 1 in which the substrate comprises silicon with a silicon dioxide top layer.

5. The method of claim 1 in which the platinum thin film layer is deposited at temperatures between 450 and 600° C.

6. The method of claim 1 in which the platinum thin film layer is deposited at a temperature of about 500° C.

7. The method of claim 1 in which the ferroelectric anneal comprises:

a first anneal at a temperature range of about 500 to 650° C. in a mixed Argon and Oxygen atmosphere; and a second anneal at a temperature range of about 700 to 750° C. in an Oxygen atmosphere.

8. The method of claim 1 in which the platinum is deposited at a temperature sufficiently above 300° C. such that the Pt 222 peak XRD Bragg reflection angle changes by less than 0.3°2θ during the PZT anneal process.

9. The method of claim 1 in which the platinum is deposited at a temperature sufficiently above 300° C. such that the full width at half maximum intensity of the Pt 222 peak changes by less than 0.3°2θ during the PZT anneal process.

* * * * *